United States Patent
Hwang et al.

(10) Patent No.: US 6,900,269 B2
(45) Date of Patent: May 31, 2005

(54) HALOGEN-FREE RESIN COMPOSITION

(75) Inventors: Kuen-Yuan Hwang, Hsinchu (TW); An-Pang Tu, Hsinchu (TW); Mong Liang, Hsinchu (TW); Chi-Yi Ju, Hsinchu (TW); Sheng-Yen Wu, Hsinchu (TW); Chun-Hsiung Kao, Hsinchu (TW); Fang-Shian Su, Hsinchu (TW)

(73) Assignee: Chang Chun Plastics Co., Ltd., Taipei (TW)

( * ) Notice: Subject to any disclaimer, the term of this patent is extended or adjusted under 35 U.S.C. 154(b) by 207 days.

(21) Appl. No.: 10/412,126

(22) Filed: Apr. 11, 2003

(65) Prior Publication Data
US 2004/0147640 A1 Jul. 29, 2004

(30) Foreign Application Priority Data
Jan. 16, 2003 (TW) ........................................ 92100846 A

(51) Int. Cl.[7] ............................ C08L 63/00; C08L 71/12
(52) U.S. Cl. ................. 525/109; 525/110; 525/113; 525/114; 525/115; 525/118; 525/523; 525/529
(58) Field of Search ................... 525/55, 107, 109, 525/110, 113, 114, 115, 118, 523, 529; 523/400, 451, 457, 461; 528/88, 89, 91, 93, 94, 95, 104, 106, 107, 116, 118, 119, 298, 403, 408, 409, 418, 421, 422, 423

(56) References Cited
U.S. PATENT DOCUMENTS 5,021,484 A * 6/1991 Schreiber et al. ............ 524/100
5,176,780 A * 1/1993 Schreiber et al. ......... 156/307.3
5,443,911 A * 8/1995 Schreiber et al. ............ 428/413
6,780,511 B2 * 8/2004 Gerber ........................ 428/414

* cited by examiner

Primary Examiner—Michael J. Feely
(74) Attorney, Agent, or Firm—Fulbright & Jaworski LLP

(57) ABSTRACT

Disclosed is a halogen-free resin composition comprising: (A) one or more phosphorus-containing epoxy resins; (B) a hardener; (C) a hardening accelerator; (D) a polyphenylene oxide resin; and (E) a filling material, wherein the hardener of component B has the structure represented by the following formula (I):

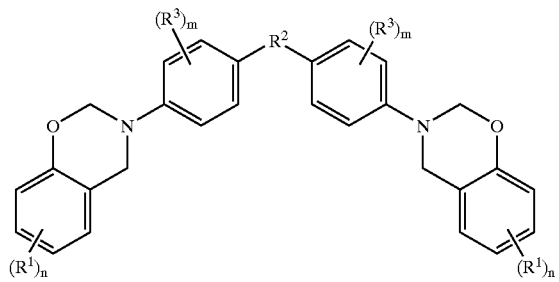

(I)

wherein each symbol is as defined above. The halogen-free resin composition of the present invention without adding halogen has excellent heat resistance and flame retardant property, and excellent dielectric property. The halogen-free resin composition of the present invention is particularly useful in the application of bonding sheets, composite materials, laminated plates, printed circuit boards, copper foil adhesives, inks used for build-up process, semiconductor packaging materials and the like.

20 Claims, No Drawings

HALOGEN-FREE RESIN COMPOSITION

FIELD OF THE INVENTION

The present invention relates to a halogen-free resin composition. The flame retardant properties of the composition can reach the UL 94V-0 standard without adding halogen, and the composition has high heat resistance and excellent dielectric property.

BACKGROUND OF THE INVENTION

Because of easy processing, high safety, excellent mechanical and chemical properties, the epoxy resin has been widely used in the field of coating, electrical insulation, construction building material, adhesives and laminated entities. Particularly, since epoxy resins have strong adhesion to reinforcement material such as glass-fiber fabric, no volatility and small shrinkage of the forming product while hardening, a laminated plate produced by such resins has the advantage of a broad range of usability, good mechanical strength, good electrical insulation property, excellent resistance to chemicals and the like. The reliability of such a laminated plate has been increased, and such an epoxy resin laminated plate has been massively applied to electrical and electronic products.

In some applications, the flame retardant properties of a printed circuit board are absolutely necessary due to the safety of human life involved when the printed circuit board is used in traffic vehicles such as airplanes, automobiles and public transportation. In order to enhance the flame retardant properties of the laminated plate, substances that can isolate the flame and reduce burning should be used. For laminated plates of epoxy resin/glass-fiber series (or organic fiber series), halogen-containing compounds, especially bromine-containing epoxy resins and hardeners, are used in combination with flame retardants such as antimony trioxide and the like, so that the flame retardant properties of the laminated plates can reach the required standard (such as the UL 94V-0 grade). Generally, for reaching the UL 94V-0 standard, the epoxy resin containing bromine as high as 17 to 21% in combination with antimony trioxide or other flame retardant are used. For example, U.S. Pat. No. 5,262,491 disclosed a composition comprising polyphenylene oxide, epoxy resin, metal salt, and curing agents. The composition reached the standard of flame retardant properties and heat resistance, and had excellent dielectric properties at high temperature. However, this patent disclosed that the composition contains about 10% to 30% of bromine to reach the standard of flame retardant properties and heat resistance. However, the use of the flame retardant containing halogen, and antimony trioxide will seriously affect the health of humans.

On the other hand, since the demand for finer circuits and higher density of the printed circuit board is increasing day by day, it has been necessary to develop a laminated plate with better electrical, mechanical, and heat resistant processing properties. For FR4 laminated plate widely used at present, the glass transition temperature (Tg) after hardening is about 130° C. Thus, when the temperature is over 200° C. during cutting and drilling and even over 270° C. during the welding procedure in a printed circuit board process, the laminated plate breaks or cracks easily. The expansion dimension of FR4 laminated plate in plane is about 12 to 17 ppm/° C. For less than 100 μm of line width/line space of a developing printed circuit board, such a laminated plate is not suitably applied in HDI field. Therefore, various laminated plate materials that emphasize high heat stability and high glass transition temperature are constantly being developed.

Therefore, in the halogen-free resin composition of the present invention, a phosphorus-containing epoxy resin (particularly, a side chain type phosphorus-containing epoxy resin) and a hardener having the benzoxazine cyclic structure are used. The flame retardant properties of such a resin composition can reach the UL 94V-0 standard without adding the halogen-containing compound or resin, and such a resin composition has higher heat resistance relative to other resin composition comprising a conventional hardener. On the other hand, the halogen-free resin composition of the present invention comprises polyphenylene oxide resin so that the composition can have excellent dielectric properties in addition to flame retardant properties and heat resistance.

Generally, the compounds having the benzoxazine cyclic structure is prepared by the reaction of a phenolic compound, an amine compound and an aldehyde compound. But many patents disclose the method for preparing the compounds having the benzoxazine cyclic structure, which are prepared by the reaction of aniline and phenolic compound. For example, U.S. Pat. No. 6,005,064 disclosed the thermosetting resin having the benzoxazine cyclic structure prepared by the reaction of a phenolic resin, formaldehyde and aniline; and JP-A-Hei-11-50123 also disclosed the method for preparing dihydrobenzoxazine thermosetting resin from bisphenol, aniline and formalin and using methyl ethyl acetone as a solvent. However, aniline used in these preparing method is toxic, and is a forbidden chemical material by the law. The preparation method cannot meet the requirements with the mass production in industry.

Therefore, the present inventors have conducted extensive studies and have found that the system was endowed with relatively high stability as using the hydrocarbon solvent to conduct the reaction of phenolic compounds, aromatic diamines and aldehyde compounds. In addition to without using toxic aniline as a reactant, it can be prevented that the compounds having the benzoxazine cyclic structure conducts the ring-reopening polymerization at high temperature due to improper temperature control. Meanwhile, the present invention can prevent the gelation or agglomeration from being occurred caused by using high polar solvent or protic solvent to undergo the reaction. Therefore, the present invention is useful in mass production in industry.

DETAILED DESCRIPTION OF THE INVENTION

The present invention provides a halogen-free resin composition comprising (A) one or more phosphorus-containing epoxy resins; (B) a hardener; (C) a hardening accelerator; (D) a polyphenylene oxide resin; and (E) a filling material, wherein the hardener component (B) has the structure represented by the following formula (I):

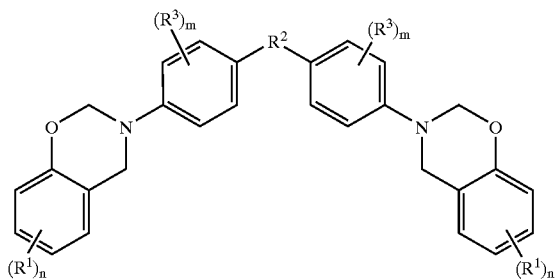

(I)

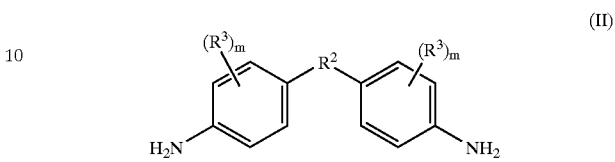

(II)

wherein $R^1$ represents one selected from the group consisting of an alkyl group, an alkenyl group, an alkoxyl group, a hydroxy group and an amino group; $R^2$ represents one selected from the group consisting of a bond, an alkylene group, O, S and $SO_2$; $R^3$ represents H or an alkyl group; and m and n are independently an integer of 0 to 4.

In the structure represented by the above formula (I), the alkyl group represented by $R^1$ and $R^3$ means linear, branched or cyclic alkyl of 1 to 6 carbon atoms, examples thereof include, but not limited to, methyl, ethyl, n-propyl, isopropyl, n-butyl, isobutyl, s-butyl, t-butyl, amyl, 2-amyl, 3-amyl, 2-methyl-1-butyl, isoamyl, s-amyl, 3-methyl-2-butyl, neo-amyl, hexyl, 4-methyl-2-amyl, cyclopentyl, cyclohexyl and the like. Alkoxy group means linear, branched or cyclic alkoxyl of 1 to 6 carbon atoms, examples thereof include, but not limited to, methoxy, ethoxy, propoxy, isopropoxy, butoxy, isobutoxy, s-butoxy, t-butoxy, amoxy, isoamoxy, neo-amoxy, hexoxy, cyclohexoxy and the like. Alkylene group means linear, branched or cyclic alkylene group of 1 to 6 carbon atoms, examples thereof include, but not limited to methylene, ethylene, propylene, butylene, amylene, hexylene, 2-methylpropylene, 2,2'-dimethylpropylene, hexylene, 2,3-dimethylbutylene and the like.

The azaoxa heterocyclic compound having the structure represented by the formula (I) is prepared by the reaction of a phenolic compound, an aromatic diamine compound, and a aldehyde compound in the presence of a solvent. The phenolic compound may be the substituted or unsubstituted phenolic compound, and examples of the substituents include, but not limited to, an alkyl group, an alkenyl group, an alkoxyl group, a hydroxy group, and an amino group.

Examples of the above substituted or unsubstituted phenolic compounds include, but not limited to, o-cresol, p-cresol, m-cresol, ethylphenol, propylphenol, isopropylphenol, butylphenol, s-butylphenol, t-butylphenol, amylphenol, isoamylphenol, hexylphenol, cyclohexylphenol, allylphenol, 4-methoxyphenol, 3-methoxyphenol, 2-methoxyphenol, 4-vinylphenol, 3-vinylphenol, 2-vinylphenol, 4-hydroxyphenol, 3-hydroxyphenol, 2-hydroxyphenol, 4-aminophenol, 3-aminophenol, 2-aminophenol, 4-hydroxycresol, 3-hydroxycresol, 2-hydroxycresol, 4-hydroxymethyl-2-methoxyphenol, 4-hydroxymethyl-3-methoxyphenol, 4-isopropyl-2-methoxyphenol, 4-isopropyl-3-methoxyphenol, 2-hydroxy-4-isopropylphenol, 3-hydroxy-4-isopropylphenol, 4-vinyl-2-methoxyphenol, 4-vinyl-3-methoxyphenol, 4-vinyl-2-hydroxyphenol, 4-vinyl-3-hydroxyphenol and the like.

The phenolic compounds used for preparing the azaoxa heterocyclic compound represented by the formula (I) are not particularly limited. The phenolic compounds can be mono-functional phenolic compounds, bi-functional phenolic compounds and multi-functional phenolic compounds, provided that at least one of hydrogen atoms on ortho-positions to the hydroxy group in the aromatic ring is unsubstituted.

The aromatic diamine compounds used for preparing the azaoxa heterocyclic compound represented by the following formula (I) is represented by the following formula (II):

wherein $R^2$, $R^3$ and m are as defined above.

To Examples of the aromatic diamine compounds represented by the formula (II) include, but not limited to, diaminobiphenyl compounds, for example, 4,4'-diaminobiphenyl, 4,4'-diamino-2,2'-dimethylbiphenyl, 4,4'-diamino-2-butyl-3-methylbiphenyl, 4,4'-diamino-2-ethyl-3-isopropylbiphenyl, 4,4'-diamino-2-methyl-3-propylbiphenyl, 4,4'-diamino-2-methylbiphenyl, 4,4'-diamino-3-isopropylbiphenyl and the like; the diaminodiphenylalkane compounds, for example, 4,4'-diaminodiphenylmethane, 4,4'-diaminodiphenylethane, 4,4'-diaminodiphenylpropane, 4,4'-methylene bis(2-methylaniline), 4,4'-ethylene bis(3-isopropylaniline), 4,4'-methylene bis(2,6-dipropylaniline), 4,4'-ethylene bis(2,5-dibutylaniline), 4,4'-methylene bis(2-ethyl-6-propylaniline), 4,4'-methylene bis(2-isopropyl-6-methylaniline) and the like; the diaminodiphenyl ether compounds, for example, 4,4'-diaminodiphenylether, di(4-amino-3-ethylphenyl)ether, di(4-amino-3-hexylphenyl)ether, di(4-amino-3,5-dimethylphenyl)ether and the like; the diaminodiphenyl thioether compound, for example, 4,4'-diaminodiphenyl thioether, di(4-amino-3-propylphenyl)thioether, di(4-amino-3-t-butylphenyl)thioether, di(4-amino-3,5-diethylphenyl) thioether and the like; the diaminodiphenyl sulfone compounds, for example, 4,4'-diaminodiphenyl sulfone, di(4-amino-3-isopropylphenyl)sulfone, di(4-amino-3,5-diamylphenyl)sulfone and the like.

The aldehyde compounds used for preparing the azaoxa heterocyclic compounds represented by the formula (I) are not particularly limited, provided that the aldehyde compounds are used for preparing the azaoxa heterocyclic compound having the benzoxazine cyclic structure. Examples of the aldehyde compound include, but not limited to, aldehyde (or vapor thereof), paraformaldehyde, polyoxymethylene and the like.

The azaoxa heterocyclic compounds represented by the formula (I) are prepared by the polymerization of a phenolic compound, an aromatic diamine compound, and a aldehyde compound, wherein the phenolic compound, the aromatic diamine compound and the aldehyde compound used in the polymerization are present in an equivalent ratio of 2:1:4.

The solvent used for preparing the azaoxa heterocyclic compounds represented by the formula (I) are not particularly limited, provided that all the reactants can be suitably dissolved in the solvent. Examples of the solvent include, but not limited to, alcohol solvents such as methanol, ethanol, propanol, isopropanol, ethandiol and the like; ether solvents such as 1,2-dimethoxyethane, tetrahydrofuran, dioxane and the like; ketone solvents such as acetone, methyl ethyl ketone, methyl isopropyl ketone and the like; ester solvents such as methyl acetate, ethyl acetate and the like; and hydrocarbon solvents such as toluene, xylene. In comparison to the above polar solvents, the hydrocarbon solvents used in the present invention have relatively low polarity. The hydrocarbon solvent only can dissolve the phenolic compound and the aromatic diamine compound, but it can scatter the aldehyde compound so that the agglomeration does not easily occur. Therefore, the stability of the reaction system is enhanced, and thus the formed azaoxa heterocyclic compounds having the benzoxazine cyclic structure will not further undergo the ring-opening polymerization at very high temperature caused by the improper temperature-control. Therefore, the preferred solvent used in the present invention is the hydrocarbon solvent.

In the halogen-free resin composition of the present invention, the phosphorus-containing epoxy resins (component A) are not limited, and they can be any phosphorus-containing epoxy resins. Among them, a side chain type phosphorus-containing epoxy resin is preferred. The preferred examples of the side chain type phosphorus-containing epoxy resin include, but not limited to, The side chain type phosphorus-containing epoxy resin prepared by directly introducing the organic cyclic phosphorus-containing compound (for example, 9,10-dihydro-9-oxa-10-phosphorylphenanthrene-10-oxide (hereinafter is referred to HCA) ) into the structure of the epoxy resin is represented by the following formula (III):

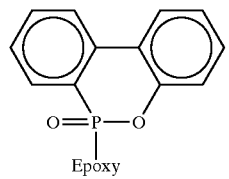

(III)

wherein Epoxy represents an epoxy resin in which at least one of epoxy groups is ring-opened; and (2) firstly reacting the organic cyclic phosphorus-containing compound HCA and the aromatic aldehyde compound with the aromatic compound having reactive hydrogens to form a multi-functional phosphorus-containing compound (the phosphorus-containing compound has bisphenol-like structure, the difference in structure between them is one hydrogen or organic group in the center of the phosphorus-containing compound structure being substituted with HCP), then undergoing the additive reaction of the multi-functional phosphorus-containing compound and epoxy resin to introduce the phosphorus-containing compound into the structure of the epoxy resin to form a side chain type phosphorus-containing epoxy resin represented by the following formula (IV):

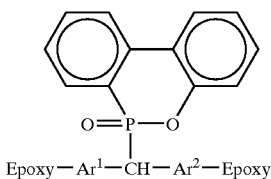

(IV)

wherein Epoxy is as defined above; and $Ar^1$ and $Ar^2$ are independently selected from:

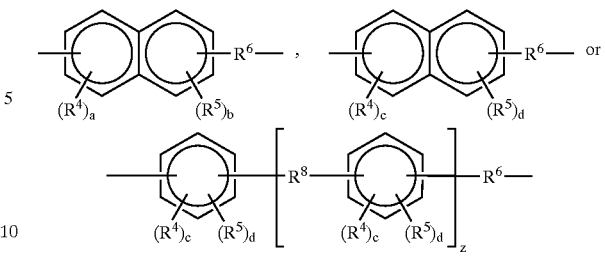

wherein $R^4$ is selected from the group consisting of —OH, —COOH, —NH$_2$, —CHO, —SH, —SO$_3$H, —CONH$_2$, —NHCOOR and an anhydride; $R^5$ is selected from the group consisting of hydrogen, an alkyl group, an alkoxyl group, a nitro group and an aromatic group; $R^6$ is selected from the group consisting of a bond or an alkylene group; $R^7$ is H or alkyl group; $R^8$ is selected from the group consisting of a bond, —CR$^5$R$^7$—, —O—, —CO—, —S—, —SO— and —SO$_2$—; a and b are independently an integer of 0 to 6, and a+b≦6; c and d are independently an integer of 0 to 4, and c+d≦4; and z is an integer of 1 to 20.

Examples of an alkyl group, an alkylene group and an alkoxy group represented by the above $R^5$, $R^6$ and $R^7$ are as defined above. An aromatic group represented by $R^5$ include phenyl, tolyl, xylyl, benzyl, naphthyl and the like.

In the halogen-free resin compound, a side chain type phosphorus-containing epoxy resin represented by the formula (III) or the formula (IV) prepared by undergoing the additive reaction of any epoxy resins and the organic cyclic phosphorus-containing compound HCA or the phosphorus-containing compound made from HCA is used as one or more phosphorus-containing epoxy resins (component A). Examples of the epoxy resin include, but not limited to, bi-functional epoxy resin. The so-called "bi-functional epoxy resin" means the resin has two or more epoxy groups per molecule, for example, the epoxy groups formed by the oxidation of olefin, the glycidyl etherification of hydroxy groups, glycidyl amination of primary and secondary amines, or glycidyl esterification of carboxylic acids.

The compounds used for undergoing such a epoxidation include catechol, resorcinol, hydroquinone and the like; bisphenols such as 2,6-hydroxynaphthalene, 2,2-bis(4-hydroxyphenyl)propane (i.e. bisphenol A), 2-(3-hydroxyphenyl)-2-(4'-hydroxyphenyl)propane, bis(4-hydroxyphenyl)methane (i.e. bisphenol F), bis(4-hydroxyphenyl)sulfone (i.e. bisphenol S), bis(4-hydroxyphenyl)thioether, bis(4-hydroxyphenyl)toluene, bis(4-hydroxyphenyl)methylcyclohexane, 4,4'-dihydroxybiphenyl, 4,4'-dihydroxybiphenyl ether, 6,6'-dihydroxy-3,3,3',3'-tetramethyl-1,1-spirodiindan and 1,3,3-trimethyl-1-(4-hydroxyphenyl)-1-indan-6-ol and the like; oligophenols such as tetraphenolicethane, naphthaleneol-cresol resol resin phenolic resin and the like; phenolic resin such as phenol-aldehyde resin, phenol aromatic alkyl group, naphthaleneol aromatic alkyl group, phenol-bicyclopentdiene copolymer resin and the like; aliphatic and aromatic amine such as ethylene diamine, propylene diamine, hexamethylene diamine, aniline, 4,4'-diaminodiphenylmethane (MDA), 4,4'-diaminodiphenyl ether, 4,4'-diaminodiphenyl sulfone, 2,2'-bis(4,4'-diaminophenyl)propane, m-xylyl diamine, p-xylyl diamine, 1,2-diaminocyclohexane, aniline aromatic alkyl resin and the like; aminophenols such as m-aminophenol, p-aminophenol, 2-(4-aminophenyl)-2-(4'-hydroxyphenyl)propane, 4-aminophenyl-4-hydroxyphenylmethane and the like; carboxylic acids such as phthalic acid, isophthalic acid, p-phthalic acid, tetrahydrophthalic acid, hexahydrophthalic acid, dimeric acid, 1,3-dicarboxyhexane and the like; and hydroxycarboxylic acids such as salicyclic acid and 4-hydroxybenzoic acid.

In the halogen-free resin composition of the present invention, the preferred epoxy resin composition used in forming a side chain type phosphorus-containing epoxy resin is glycidyl ethers. Examples of monomers for the epoxy resin include: bisphenol glycidyl ether, biphenyol glycidyl ether, benzenediol glycidyl ether, nitrogen-containing hetero-ring glycidyl ether, dihydroxynaphthalene glycidyl ether, phenolic glycidyl ether, polyhydric phenol glycidyl ether and the like.

Examples of bisphenol include: bisphenol A glycidyl ether, bisphenol F glycidyl ether, bisphenol AD glycidyl ether, bisphenol S glycidyl ether, tetramethylbisphenol A glycidyl ether, tetramethylbisphenol F glycidyl ether, tetramethylbisphenol AD glycidyl ether, tetramethylbisphenol S glycidyl ether and the like.

Examples of biphenol glycidyl ether include: 4,4'-biphenol glycidyl ether, 3,3'-dimethyl-4,4'-biphenol glycidyl ether, 5,5'-tetramethyl-4,4'-biphenol glycidyl ether and the like.

Examples of benzenediol glycidyl ether include: resorcinol glycidyl ether, hydroquinone glycidyl ether, isobutylhydroquinone glycidyl ether and the like.

Examples of nitrogen-containing hetero-ring glycidyl ether include: triglycidyl ether of isocyanurate, triglycidyl ether of cyanurate and the like.

Examples of dihydroxynaphthalene glycidyl ether include: 1,6-dihydroxynaphthalenediglycidyl ether, 2,6-dihydroxynaphthalenediglycidyl ether and the like.

Examples of phenolic polyglycidyl ethers include: phenolic polyglycidyl ether, cresol phenolic polyglycidyl ether, bisphenol A phenolic polyglycidyl ether and the like.

Examples of phenylpolyhydric phenol glycidyl ether include: tris(4-hydroxyphenyl)methane polyglycidyl ether, tris(4-hydroxyphenyl)ethane polyglycidyl ether, tris(4-hydroxyphenyl)propane polyglycidyl ether, tris(4-hydroxyphenyl)butane polyglycidyl ether, tris(3-methyl-4-hydroxyphenyl)methane polyglycidyl ether, tris(3,5-dimethyl-4-hydroxyphenyl)methane polyglycidyl ether, tetrakis(4-hydroxyphenyl)ethane polyglycidyl ether, tetrakis(3,5-dimethyl-4-hydroxyphenyl)ethane polyglycidyl ether, dicyclopentene-phenolic polyglycidyl ether and the like.

The additive reaction for preparing a side chain type phosphorus-containing epoxy resin represented by the formula (III) or formula (IV) can be conducted in molten state without solvent, or in reflux with solvent. Examples of the solvent used in reflux include, but not limited to: ketones such as acetone, methyl ethyl ketone, methyl isobutyl ketone and the like; ethers such as ethylene glycol monomethyl ether, propylene glycol monomethyl ether and the like; esters such as ethyl acetate, ethyl isopropionate, propylene glycol monomethyl ether acetate and the like; hydrocarbons such as toluene and xylene and the like; and aprotic solvent such as N,N-dimethylformamide, N,N-diethylformamide, and dimethylsulfoxide and the like.

The reaction for preparing a side chain type phosphorus-containing epoxy resin represented by the formula (III) or formula (IV) typically is carried out at a temperature of 50 to 350° C., preferably 50 to 300° C., more preferably 100 to 250° C., and still more preferably 100 to 200° C. The side reaction tends to occur and the reaction rate is not easily controlled if the temperature is higher than 350° C., which will speed up the deterioration of the resin. On the other hand, the efficiency of the reaction gets worse and the formed resin cannot be applied in the high temperature environment if the reaction temperature is lower than 50° C.

In the halogen-free resin composition of the invention, these phosphorus-containing epoxy resins can be used singly or in combination as a mixture of two or more different kind of resins. One or more phosphorus-containing epoxy resins (component A) are typically used in an amount of 40 to 80 percent by weight, preferably 50 to 80 percent by weight, and more preferably 60 to 80 percent by weight based on the total amount of the phosphorus-containing epoxy resins (component A) and the hardener (component B). If the amount of one or more phosphorus-containing epoxy resins (component A) is smaller than 40 percent by weight, the heat resistance and the flame retardant properties of the product after hardening tend to be insufficient, which is not beneficial in application.

In the halogen-free resin composition of the invention, examples of the hardening accelerator (component C) include: tertiary amine, tertiary phosphine, quaternary ammonium salt, quaternary phosphonium salt, boron trifluoride complex salt, lithium-containing compound, imidazole compound or mixtures thereof.

Examples of the tertiary amines include: triethylamine, tributylamine, dimethylaniline, α-methylbenzyldimethylamine, dimethylaminoethanol, N,N-dimethyl-aminocresol, tri(N,N-dimethyl-aminomethyl) phenol and the like.

Examples of tertiary phosphines include triphenylphosphine.

Examples of quaternary ammonium salt include: tetramethylammonium chloride, tetramethylammonium bromide, tetramethylammonium iodide, tetraethylammonium chloride, tetraethylammonium bromide, tetrabutylammonium iodide, tetrabutylammonium chloride, tetrabutylammonium bromide, tetrabutylammonium iodide, triethylbenzylammonium chloride, triethylbenzylammonium bromide, triethylbenzylammonium iodide, triethylphenylethylammonium chloride, triethylphenylethyl ammonium bromide, triethylphenylethylammonium iodide and the like.

Examples of quaternary phosphonium salt include: tetrabutylphosphonium chloride, tetrabutylphosphonium bromide, tetrabutylphosphonium iodide, tetrabutylphosphonium acetate, tetraphenylphosphonium chloride, tetraphenylphosphonium bromide, tetraphenylphosphonium iodide, ethyltriphenylphosphonium chloride, ethyltriphenylphosphonium bromide, ethyltriphenylphosphonium iodide, ethyltriphenylphosphonium acetate, ethyltriphenylphosphonium phosphate, propyltriphenylphosphonium chloride, propyltriphenylphosphonium bromide, propyltriphenylphosphonium iodide, butyltriphenylphosphonium chloride, butyltriphenylphosphonium bromide, butyltriphenylphosphonium iodide and the like.

Examples of imidazole compound include: 2-methylimidazole, 2-ethylimidazole, 2-laurylimidazole, 2-heptadecylimidazole, 2-phenylimidazole, 4-methylimidazole, 4-ethylimidazole, 4-laurylimidazole, 4-heptadecylimidazole, 2-phenyl-4-methylimidazole, 2-phenyl-4-hydroxymethylimidazole, 2-ethyl-4-methylimidazole, 2-ethyl-4-hydroxymethylimidazole, 1-cyanoethyl-4-methylimidazole, 2-phenyl-4,5-dihydroxymethylimidazole and the like.

These hardening accelerators can be used singly or in combination as a mixture of two or more different kind of hardening accelerators. Among them, the hardening accelerator is preferably the imidazole compound and the quaternary phosphonium salt, especially preferably 2-methylimidazole, 2-phenylimidazole, ethyltriphenylphosphonium acetate or mixtures thereof.

In the halogen-free resin composition of the invention, the hardening accelerator is used in an amount of 0.01 to 1 percent by weight, preferably 0.01 to 0.5 percent by weight, and more preferably 0.02 to 0.1 percent by weight relative to the total weight of the resin composition.

In the resin composition of the present invention, the polyphenylene oxide resin (component D) has the structure unit represented by the following formula (V):

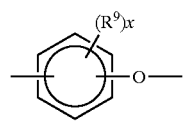

(V)

wherein $R^9$ represents one selected from the group consisting of an alkyl group, an alkoxyl group, an aromatic group, an amino group, and a hydroxy group; and x is an integer of 0 to 4.

Examples of the monomers used for preparing polyphenylene oxide resin (component D) include, but not limited to, 2,6-dimetehylphenol, 2,6-diethylphenol, 2,6-dipropylphenol, 2,6-dibutylphenol, 2,6-diphenylphenol, 2,6-dimethoxyphenol, 2,6-diethoxyphenol, 2-methoxy-6-ethoxyphenol, 2,3,6-trimethylphenol, 2,3,5,6-tetramethylphenol, 2-methyl-6-isobutylphenol, 2-methyl-6-phenylphenol, 2,6-diphenylphenol, 2,6-ditolylphenol and the like. All the homopolymers, copolymers or other modified polyphenylene oxide resin derived from these monomers can be used as the polyphenylene oxide resin in the resin composition of the present invention.

The polyphenylene oxide resin can be prepared by a variety of conventional methods, for example, in oxidative coupling catalytic system at least one of corresponding monohydroxy aromatic compound is used to undergo polymerization. Examples of the monohydroxy aromatic compound include, but not limited to, dimethylphenol, 2,3,6-trimethylphenol and the like.

The molecular weight of the polyphenylene oxide resin as component D is typically in the range of 10,000 to 100,000, preferably 20,000 to 80,000, and more preferably 35,000 to 65,000, and typically has the particle diameter of 1 to 200 μm, preferably 5 to 100 μm, and more preferably 5 to 50 μm. In the halogen-free resin composition of the invention, the polyphenylene oxide resin (component D)is typically used in an amount of 10 to 50 percent by weight, preferably 20 to 40 percent by weight, and more preferably 25 to 35 percent by weight based on the total solid amount of the phosphorus-containing epoxy resins (component A) and the hardener (component B).

In the resin composition of the invention, examples of the filling material (component E) include: silicon dioxide powder (including spherical and horn-type molten silicon dioxide, crystalline silicon dioxide, etc.), quartz glass powder, talc powder, alumina powder, aluminum hydroxide powder, magnesium hydroxide powder, calcium carbonate powder, aluminum nitride compound, boron nitride compound, zinc borate and the like, these filling materials can be used singly or in combination as a mixture of two or more different kind of filling materials. Preferably, these filling materials have the average particle diameter of 1 to 40 μm. The viscosity of the resin composition increases and the flowability decreases if the average particle diameter is less than 1 μm. The distribution between the resin and the filling material in the resin composition is not even if the average particle diameter is more than 40 μm.

In the halogen-free resin composition of the invention, the filling material is used in an amount of 20 to 150 percent by weight, preferably 30 to 100 percent by weight, and more preferably 40 to 80 percent by weight based on the total solid amount of components (A), (B), and (C) in the resin composition.

The halogen-free resin composition of the invention can be formulated into varnish and used. The viscosity of the resin composition can be adjusted by the addition of a suitable solvent when the resin composition of the invention is formulated into varnish. The viscosity of the resin composition is preferably in the range of 20 to 500 cps/25° C.

The solvents used for adjusting the viscosity of the resin composition include organic aromatic solvents, protic solvents, ketones, ethers, esters and the like.

Examples of the organic aromatic solvents include toluene and xylene; examples of protic solvents include N,N-dimethylformamide, N,N-diethylformamide, dimethylsulfoxide and the like; examples of ketones include methyl ethyl ketone, methyl isobutyl ketone and the like; examples of ethers include ethylene glycol monomethyl ether, propylene glycol monomethyl ether and the like; and examples of esters include ethyl acetate, ethyl isopropionate, propylene glycol monomethyl ether acetate and the like.

Optional additives or modifiers used in the halogen-free resin composition of the invention include heat stabilizers, light stabilizers, UV assorbents, plasticizers and the like.

The prepreg can be manufactured by impregnating the suitable substrate into the varnish formulated by the halogen-free resin composition of the invention and drying the impregnated substrate with heat. Examples of these substrates include, but not limited to, fiber substrate, for example, glass fiber, metallic fiber, carbon fiber, aramide fiber, PBO fiber, LCP fiber, Kelvar fiber, aromatic ester, boron, cellulose and the like; mat substrate, for example, glass fiber cloth; and paper substrate, for example, aramide paper, LPC paper and the like. The prepreg can be further made into composite material laminated plates, or it can be used alone in a binding layer of prepregs. As well, copper foil is placed on one surface or both surfaces of a prepreg or a combination of more prepregs, which is then pressurized and heated to obtain a laminate plate. The laminated plate thus obtained is by far superior to the standards of the present products in the market in respect to size stability, resistance to chemicals, resistance to corrosion, moisture absorption and electrical properties, and is suitable in producing electrical products for electronics, space and transport, for example, in producing printed circuit boards, multi-layer circuit boards and the like.

The hardening reaction for the halogen-free resin composition of the invention is typically carried out at a temperature of 20 to 350° C., preferably 50 to 300° C., more preferably 100 to 250° C., and still more preferably 120 to 220° C. The side reaction tends to occur and the hardening reaction rate is not easily controlled if the hardening reaction temperature is too high, which will speed up the deterioration of the resin. On the other hand, the efficiency of the hardening reaction gets worse and the formed resin cannot be applied in the high temperature environment if the hardening reaction temperature is too low.

The flame retardant properties of the halogen-free resin composition of the invention can reach the UL 94V-0 standard without adding other processing aids and flame retardant additives, especially halogen, and the resin composition has high heat resistance and excellent dielectric property.

The features and the effects of present invention will be described in more detail by way of examples, which should not be construed as limiting the scope of the invention.

EXAMPLES

Each component used in examples and synthesis examples is illustrated as following:

Epoxy resin 1 represents a diglycidyl ether of bisphenol A, sold under trade name BE188EL and manufactured by Chang Chun Plastics Co., Ltd., Taiwan. The epoxy equivalent weight thereof is in the range of 185 to 195 g/eq, the hydrolytic chlorine content is below 200 ppm, and the viscosity is in the range of 11000 to 15000 cps/25° C.

Hardener A represents a solution of 10% dicyanodiamide (DICY) in DMF.

Hardener B represents a phenol-fomaldehyde resin, sold under trade name BEH510A70 and manufactured by Chang Chun Plastics Co., Ltd., Taiwan. The equivalent weight of the reactive hydrogen in the hardener is in the range of 105 to 110 g/eq.

Hardening accelerator A represents a solution of 10% 2-methylimidazole (2MI) in methyl ethyl ketone.

The epoxy equivalent weight (EEW), the varnish viscosity, and solid content herein are measured by the following method:

(1) Epoxy equivalent weight: the epoxy resin is dissolved in a mixed solvent (chlorobenzene: chloroform=1:1), then the mixture is titrated with HBr/glacial acetic acid. EEW is determined according to the method in ASTM D1652. The indicator used is crystal violet.

(2) Viscosity: the varnish of the epoxy resin composition is placed into a thermostat at 25° C. for 4 hours, and the viscosity is measured by a Brookfield viscosimeter at 25° C.

(3) Solid content: After baking 1 g of the varnish sample containing the epoxy resin composition at 150° C. for 60 minutes, the non-volatile components in weight % are determined, which is the solid content.

Synthesis Example 1

216 g of a dried 9,10-dihydro-9-oxa-10-phosphorylphenanthrene-10-oxide (hereinafter is referred to the organic cyclic phosphorus-containing compound, HCA) was charged into a 3000 mL of five-neck glass autoclave equipped with an electrically-heating mantle, a temperature-controlling apparatus, an electrically-driving stirrer, a stirring bar, a thermocouple, a water-cooling condenser and an addition funnel, and then HCA is dissolved by heating under stirring in the glass autoclave. After heated up to 110° C., 112 g of 4-hydroxybenzaldehyde and 940 g of phenol were added. The reaction is conducted for at least 3 hours. Subsequently, the unreacted phenol was recovered. The product was washed with methanol after the reaction had completed. After cooling to room temperature, the product was filtered and dried, and 9,10-dihydro-9-oxa-10-phosphorylphenanthrene-10-oxide-10-yl)-(4-hydroxyphenyl)methanol (hereinafter is referred to the phosphorus-containing compound, HPP) was obtained.

1000 g of epoxy resin 1 and 550 g of phosphorus-containing compound HPP were charged into a 3000 mL of five-neck glass autoclave equipped with an electrically-heating mantle, a temperature-controlling apparatus, an electrically-driving stirrer, a stirring bar, a nitrogen inlet, a thermocouple, a water-cooling condenser and an addition funnel, and then the temperature was raised up to 120° C. under nitrogen atmosphere. After the epoxy resin 1 and the phosphorus-containing compound HPP had completely dissolved, the reactants were dried under a vacuum, then let the nitrogen flow in and vacuated again, which was repeated twice. After the temperature of the autoclave was cooled to 85 to 90° C., 6.0 g of triphenylphosphine was added. The epoxy resin and triphenylphosphine were stirred by stirrer, and let the nitrogen flow in. Then, the mixture is heated up to 160° C. and maintained for 10 minutes. After the reaction had released heat slowly and the temperature was raised up to 180° C. and maintained for 3 hours, the phosphorus-containing epoxy resin A was obtained. The theoretical value of the epoxy equivalent weight of the phosphorus-containing epoxy resin A was 582, and the found value was 605; and the theoretical phosphorus content was 2.66 percent by weight. Propylene glycol monomethyl ether was added into the obtained phosphorus-containing epoxy resin A to dissolve the phosphorus-containing epoxy resin, and the phosphorus-containing epoxy resin A having 60% solid content was obtained.

Synthesis Example 2

240 g of dianilinemethane, 228 g of phenol, 156.8 g of 92% paraformaldehyde and 300 g of toluene were successively charged into a 1 L of four-neck reaction vessel equipped with a stirrer, a thermometer, a pressure reducing system, and a condensing-heating mantle. After the reaction system was heated up to 50° C., the electric source for heating was shut. The reaction is conducted for 2.5 hours while maintaining the temperature in the range of 85 and 90° C. after the system released heat Subsequently, in order to recover toluene, the internal pressure was reduced and the temperature was raised. After reaching 130° C. of the temperature and more than 650 mm Hg of the vacuum pressure, and recovering all of toluene, the obtained product was dissolved by adding methyl ethyl ketone, and the synthesis resin B having 60% solid content was obtained.

Synthesis Example 3

4000 g (32.7 mol) of 2,6-dimethylphenol, 66 g (1.6 mol) of sodium hydroxide, 429 g (3.3 mol) of dibutylamine, 816 g (8.1 mol) of N,N'-dimethylbutylamine, 20 L of toluene, and 78.5 g (0.35 mol) of copper (II) bromide were charged into a 50 L of stainless steel (SS316) autoclave. Let the oxygen gas flow into the reaction system at the rate of 1 L/min at 38° C. under 1 atm. The polymerization reaction was conducted for 2 hours under stirring at 300 rpm. After the polymerization reaction was completed, the stirring was stopped, the oxygen gas in the reaction system was replaced with the nitrogen gas, and 1600 mL of 1N HCl solution was added into the reaction solution to quench the reaction. 20 L of 1% $Na_3EDTA$ was added into the reaction solution and the mixture was stirred for 10 minutes. Then, let the resulting solution stand still to separate off layers. After the aqueous layer was removed, 20 L of deionized water was added into the organic layer, and the mixture was stirred for 10 minutes. Let the mixture stand still to separate off layers. After the aqueous layer was removed, 25 L of methanol was slowly added into the organic layer, and 3620 g of synthesis resin C1 was obtained. Yield: 92%, and inherent viscosity: 0.21 dl/g.

Synthesis Example 4

4000 g (32.7 mol) of 2,6-dimethylphenol, 73 g (1.8 mol) of sodium hydroxide, 950 g (12.0 mol) of pyridine, 3.2 L of methanol, 18 L of toluene, and 32.5 g (0.35 mol) of copper (II) chloride were charged into a 50 L of stainless steel (SS316) autoclave. Let the oxygen gas flow into the reaction system at the rate of 1 L/min at 40° C. under 1 atm. The polymerization reaction was conducted for 2 hours under stirring at 300 rpm. After the polymerization reaction was completed, the stirring was stopped, the oxygen gas in the reaction system was replaced with the nitrogen gas, and 1600 mL of 1N HCl solution was added into the reaction solution to quench the reaction. 20 L of 1% $Na_3EDTA$ was added into the reaction solution and the mixture was stirred for 10 minutes. Then, let the resulting solution stand still to separate off layers. After the aqueous layer was removed, 20 L of deionized water was added into the organic layer, and the mixture was stirred for 10 minutes. Let the mixture stand still to separate off layers. After the aqueous layer was removed, 25 L of methanol was slowly added into the organic layer, and 3040 g of synthesis resin C2 was obtained. Yield: 77%, and inherent viscosity: 0.23 dl/g.

Synthesis Example 5

4000 g (32.7 mol) of 2,6-dimethylphenol, 73 g (1.8 mol) of sodium hydroxide, 105 g (0.18 mol) of dibutylamine, 20 L of toluene, and 10.2 g (0.018 mol) of manganese chloride ($MnCl_2$) were charged into a 50 L of stainless steel (SS316) autoclave. Let the oxygen gas flow into the reaction system at the rate of 1 L/min at 30° C. under 1 atm. The polymerization reaction was conducted for 2 hours under stirring at 300 rpm. After the polymerization reaction was completed, the stirring was stopped, the oxygen gas in the reaction system was replaced with the nitrogen gas, and 1600 mL of 1N HCl solution was added into the reaction solution to quench the reaction. 20 L of 1% $Na_3EDTA$ was added into the reaction solution and the mixture was stirred for 10 minutes. Then, let the resulting solution stand still to separate off layers. After the aqueous layer was removed, 20 L of deionized water was added into the organic layer, and the mixture was stirred for 10 minutes. Let the mixture stand still to separate off layers. After the aqueous layer was removed, 25 L of methanol was slowly added into the organic layer, and 3808 g of synthesis resin C4 was obtained. Yield: 95% and inherent viscosity: 0.62 dl/g.

Working Examples 1 to 4 and Comparative Examples 1 to 3

Components used in a listed amount shown in Table 1 are formulated into epoxy resin varnishes in a vessel equipped with a stirrer and a condenser at room temperature.

TABLE 1

|  | Working Example 1 | Working Example 2 | Working Example 3 | Working Example 4 | Comparative Example 1 | Comparative Example 2 | Comparative Example 3 |
|---|---|---|---|---|---|---|---|
| Epoxy Resin A (g) | 480 | 480 | 480 | 480 | 480 | 480 | 480 |
| Epoxy Resin B (g) | 180 | 180 | 180 | 180 | 180 |  |  |
| Hardener A |  |  |  |  |  | 5.04 |  |
| Hardener B |  |  |  |  |  |  | 64 |
| Synthesis Resin C1 (g) | 120 |  |  |  |  |  |  |
| Synthesis Resin C2 (g) |  | 120 |  |  |  |  |  |
| Synthesis Resin C3 (g) |  |  | 120 |  |  |  |  |
| Synthesis Resin C4 (g) |  |  |  | 120 |  |  |  |
| Catalyst A | 1.08 | 1.08 | 1.08 | 1.08 | 1.08 | 0.38 | 0.44 |
| $SiO_2$ (5 μm) | 77 | 77 | 77 | 77 | 77 | 77 | 77 |
| toluene | 180 | 180 | 180 | 180 |  |  |  |
| propylene glycol monomethyl ether |  |  |  |  |  |  | 7 |
| Dimethylformamide |  |  |  |  |  | 48 |  |

1N HCl solution was added into the reaction solution to quench the reaction. 20 L of 1% $Na_3EDTA$ was added into the reaction solution and the mixture was stirred for 10 minutes. Then, let the resulting solution stand still to separate off layers. After the aqueous layer was removed, 20 L of deionized water was added into the organic layer, and the mixture was stirred for 10 minutes. Let the mixture stand still to separate off layers. After the aqueous layer was removed, 25 L of methanol was slowly added into the organic layer, and 3748 g of synthesis resin C3 was obtained. Yield: 93%, and inherent viscosity: 0.42 dl/g.

Synthesis Example 6

4000 g (32.7 mol) of 2,6-dimethylphenol, 73 g (1.8 mol) of sodium hydroxide, 85 g (0.66 mol) of dibutylamine, 20 L of toluene, and 12.5 g (0.096 mol) of manganese chloride ($MnCl_2$) were charged into a 50 L of stainless steel (SS316) autoclave. Let the oxygen gas flow into the reaction system at the rate of 1 L/min at 25° C. under 1 atm. The polymerization reaction was conducted for 3.5 hours under stirring at 300 rpm. After the polymerization reaction was completed, the stirring was stopped, the oxygen gas in the reaction system was replaced with the nitrogen gas, and A glass fiber cloth was impregnated in the phosphorus-containing epoxy resin varnish formulated above, then dried at 170° C. to obtain prepreg. Eight pieces of the above prepreg were piled up, and a sheet of 35 μm copper foil was placed on the top and bottom sides of the eight prepregs, then laminated at 200° C. under a pressure of 25 kg/cm² to form a laminated entities of the phosphorus-containing epoxy resin and the glass fiber cloths. According to IPC-TM-650-2.4.25 and IPC-TM-650-2.4.8 standard, the glass transition temperature and the peeling strength of the laminated entities were determined respectively. According to IPC-TM-650-2.5.17 standard, the surface resistance and the volume resistance were determined. According to IPC-TM-650-2.5.5.4 standard, the dielectric constant and the dissipation factor were determined. The results are given in Table 2.

TABLE 2

| Test Item | Working Example 1 | Working Example 2 | Working Example 3 | Working Example 4 | Comparative Example 1 | Comparative Example 2 | Comparative Example 3 |
|---|---|---|---|---|---|---|---|
| Burning Test | 94-V0 | 94-V0 | 94-V0 | 94-V0 | 94-V0 | 94-V0 | 94-V0 |
| Solder Resistance (288° C.) | >180 sec. | >180 sec. | >180 sec. | >180 sec. | >180 sec. | >180 sec. | >180 sec. |
| Tg (DSC) | 162° C. | 161° C. | 162° C. | 164° C. | 163° C. | 138° C. | 144° C. |
| Peeling Strength | 10.2 | 9.95 | 10.04 | 9.96 | 9.45 | 9.87 | 9.1 |
| Surface Resistance | $3.8 * 10^{14}$ | $9.4 * 10^{14}$ | $2.5 * 10^{14}$ | $4.1 * 10^{14}$ | $2.3 * 10^{14}$ | $3.6 * 10^{14}$ | $1.3 * 10^{14}$ |
| Volume Resistance | $4.7 * 10^{15}$ | $7.6 * 10^{15}$ | $6.6 * 10^{15}$ | $77 * 10^{15}$ | $5.8 * 10^{15}$ | $4.3 * 10^{15}$ | $5.7 * 10^{15}$ |
| Dielectric Constant | 3.89 | 3.94 | 3.92 | 3.92 | 4.43 | 4.73 | 4.62 |
| Dissipation factor | 0.008 | 0.009 | 0.008 | 0.008 | 0.011 | 0.021 | 0.016 |

From the results in Table 2, it can see that the flame retardant properties of the halogen-free resin composition of the invention can reach the UL 94V-0 standard without adding halogen-containing components. Also, the halogen-free resin composition of the invention has relatively high heat resistance as compared with the resin composition comprising the conventional hardener. Furthermore, the halogen-free resin composition of the invention has relatively low dielectric constants compared with the polyphenylene oxide resin-free resin composition.

Working Examples 5 to 8

Components used in a listed amount shown in Table 3 are formulated into epoxy resin varnishes in a vessel equipped with a stirrer and a condenser at room temperature.

TABLE 3

| | Working Example 5 | Working Example 6 | Working Example 7 | Working Example 8 |
|---|---|---|---|---|
| Epoxy Resin A (g) | 600 | 600 | 600 | 600 |
| Synthesis Resin B (g) | 240 | 240 | 240 | 240 |
| Synthesis Resin C1 (g) | 100 | | | |
| Synthesis Resin C2 (g) | | 100 | | |
| Synthesis Resin C3 (g) | | | 100 | |
| Synthesis Resin C4 (g) | | | | 100 |
| Catalyst A | 1.21 | 1.21 | 1.21 | 1.21 |
| SiO$_2$ (5 μm) | 20 | 20 | 20 | 20 |
| toluene | 100 | 100 | 100 | 100 |

The phosphorus-containing epoxy resin varnish formulated according to Table 3 was coated on the rough surface of 18 μm copper foil, the coating thickness was 80 μm, and then dried at 150° C. to obtain the copper foil sample. The resulting copper foil sample was placed on the top and bottom sides of the laminated plate obtained from Working Example 1, which was laminated at 185° C. under a pressure of 25 kg/cm² into a multi-layer board. The physical properties of the multi-layer board were tested according to the above standards, and the results were shown in Table 4.

TABLE 4

| Test Item | Working Example 5 | Working Example 6 | Working Example 7 | Working Example 8 |
|---|---|---|---|---|
| Burning Test | 94-V0 | 94-V0 | 94-V0 | 94-V0 |
| Solder Resistance (288° C.) | >180 sec. | >180 sec. | >180 sec. | >180 sec. |

TABLE 4-continued

| Test Item | Working Example 5 | Working Example 6 | Working Example 7 | Working Example 8 |
|---|---|---|---|---|
| Tg (DSC) | 162° C. | 163° C. | 166° C. | 165° C. |
| Peeling Strength (IPC spec. > 6 lb/in (18 μm)) | 7.21 | 7.15 | 7.44 | 7.32 |
| Surface Resistance | $4.1 * 10^{14}$ | $5.2 * 10^{14}$ | $4.9 * 10^{14}$ | $3.3 * 10^{14}$ |
| Volume Resistance | $2.6 * 10^{15}$ | $4.1 * 10^{15}$ | $5.6 * 10^{15}$ | $6.3 * 10^{15}$ |
| Dielectric Constant | 3.77 | 3.76 | 3.74 | 3.7 |
| Dissipation factor | 0.008 | 0.008 | 0.009 | 0.008 |

As shown in Table 4, the laminated entities have even lower dielectric constants when the formulations of Working Examples 5 to 8 serves as additional layers.

What is claimed is:

1. A halogen-free resin composition, comprising the following components:
   (A) one or more phosphorus-containing epoxy resins;
   (B) a hardener;
   (C) a hardening accelerator;
   (D) a polyphenylene oxide resin; and
   (E) a filling material, wherein the hardener of component (B) has the structure represented by the following formula (I):

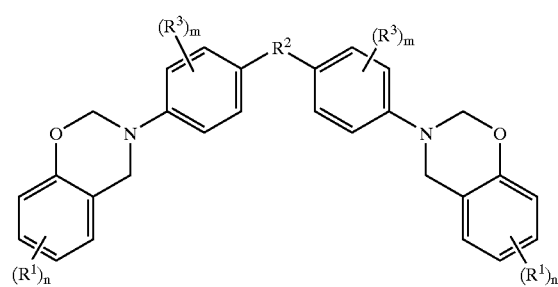

(I)

wherein $R^1$ is one selected from the group consisting of an alkyl group, an alkenyl group, an alkoxyl group, a hydroxy group and an amino group; $R^2$ is one selected from the group consisting of a bond, an alkylene group, O, S and SO$_2$; $R^3$ is H or an alkyl group; and and n are independently an integer of 0 to 4.

2. The composition according to claim 1, wherein $R^1$ is t-butyl; $R^2$ is methylene; and in is 0 and n is 1.

3. The composition according to claim 1, wherein the hardener having the structure represented by the formula (I) is one prepared by the reaction of a phenolic compound, an aromatic diamine compound, and a aldehyde compound in the presence of a solvent.

4. The composition according to claim 3, wherein the phenolic compound is phenol; the aromatic diamine compound is 4,4'-diaminodiphenylmethane; the aldehyde compound is paraformaldehyde; and the solvent is aromatic hydrocarbon solvent.

5. The composition according to claim 1, wherein the phosphorus-containing epoxy resin is a side chain type phosphorus-containing epoxy resin represented by the following formula (III):

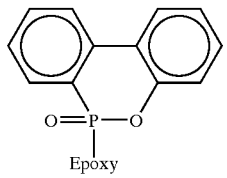

(III)

wherein Epoxy is an epoxy resin in which one of epoxy groups is ring-opened.

6. The composition according to claim 5, wherein the side chain type phosphorus-containing epoxy resin is one prepared by introducing 9,10-dihydro-9-oxa-10-phosphorylphenanthrene-10-oxide into the structure of the epoxy resin.

7. The composition according to claim 1, wherein the phosphorus-containing epoxy resin is a side chain type phosphorus-containing epoxy resin represented by the following formula (IV):

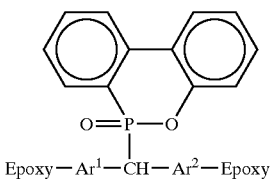

(IV)

wherein Epoxy is an epoxy resin in which one of epoxy groups is ring-opened and $Ar^1$ and $Ar^2$ are independently selected from:

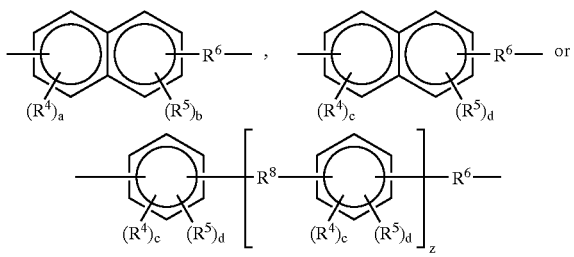

wherein $R^4$ is selected from the group consisting of —OH, —COOH, —NH$_2$, —CHO, —SH, —SO$_3$H, —CONH$_2$, —NHCOOR and an anhydride; $R^5$ is selected from the group consisting of hydrogen, an alkyl group, an alkoxyl group, a nitro group and an aromatic group; $R^6$ is a bond or an alkylene group; $R^7$ is hydrogen or alkyl group; $R^8$ is selected from the group consisting of a bond, —CR$^5$R$^7$—, —O—, —CO—, —S—, —SO— and —SO$_2$—; a and b are independently an integer of 0 to 6, and a+b≦6; c and d are independently an integer of 0 to 4, and c+d≦4; and z is an integer of 1 to 20.

8. The composition according to claim 7, wherein the side chain type phosphorus-containing epoxy resin is one prepared by undergoing the additive reaction of 9,10-dihydro-9-oxa-10-phosphorylphenanthrene-10-oxide and an aromatic aldehyde compound, and then undergoing the condensation reaction with an aromatic compound having reactive hydrogens to produce a phosphorus-containing compound, and subsequently reacting the phosphorus-containing compound with an epoxy resin.

9. The composition according to claim 8, wherein the aromatic aldehyde compound is 4-hydroxybenzaldehyde; and the aromatic compound having reactive hydrogens is phenol.

10. The composition according to claim 8, wherein the epoxy resin is one derived from monomers selected from the group consisting of bisphenol glycidyl ether, biphenyl glycidyl ether, benzenediol glycidyl ether, nitrogen-containing hetero-ring glycidyl ether, dihydroxynaphthalene glycidyl ether, phenolic glycidyl ether, and polyhydric phenol glycidyl ether.

11. The composition according to claim 1, wherein the one or more phosphorus-containing epoxy resins of component A are used in an amount of 40 to 80 percent by weight based on the total amount of the phosphorus-containing epoxy resins of component A and the hardener of component B.

12. The composition according to claim 1, wherein the hardening accelerator of component C is one selected from the group consisting of tertiary amine, tertiary phosphine, quaternary ammonium salt, quaternary phosphonium salt, boron trifluoride complex salt, lithium-containing compound, imidazole compound and mixtures thereof.

13. The composition according to claim 1, wherein the hardening accelerator is used in an amount of 0.01 to 1 percent by weight relative to the total weight of the resin composition.

14. The composition according to claim 1, wherein the polyphenylene oxide resin of component D has the structure unit represented by the following formula (V):

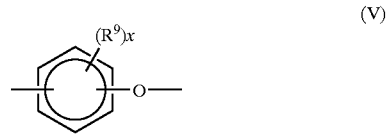

(V)

wherein $R^9$ is one selected from the group consisting of an alkyl group, an alkoxyl group, an aromatic group, an amino group, and a hydroxy group; and x is an integer of 0 to 4.

15. The composition according to claim 14, wherein $R^9$ is methyl; and x is 2.

16. The composition according to claim 1, wherein the polyphenylene oxide resin of component D is used in an amount of 10 to 50 percent by weight based on the total solid amount of the phosphorus-containing epoxy resins of component A and the hardener of component B.

17. The composition according to claim 1, wherein the filling material of component E is one selected from the group consisting of silicon dioxide powder, quartz glass powder, talc powder, alumina powder, aluminum hydroxide powder, magnesium hydroxide powder, calcium carbonate powder, zinc borate, aluminum nitride compound, boron nitride compound and mixtures thereof.

18. The composition according to claim 17, wherein the filling material of component E is silicon dioxide powder.

19. The composition according to claim 1, wherein the filling material of component E is used in an amount of 20 to 150 percent by weight based on the total solid amount of components (A), (B), and (C) in the resin composition.

20. The composition according to claim 1, wherein the composition is useful in the application of bonding sheets, composite materials, laminated plates, printed circuit boards, copper foil adhesives, inks used for build-up process, and semiconductor packaging materials.

* * * * *